United States Patent
Ristimäki et al.

(10) Patent No.: US 12,274,038 B2
(45) Date of Patent: Apr. 8, 2025

(54) ELECTRIC POWER CONVERTER, SUCH AS AN ELECTRIC MOTOR DRIVE FOR DRIVING AN ELECTRIC MOTOR AND METHOD FOR OPERATING THE ELECTRIC MOTOR DRIVE

(71) Applicant: Vacon Oy, Vaasa (FI)

(72) Inventors: Ari Ristimäki, Laihia (FI); Juha Norrena, Mustasaari (FI); Tuomas Yli-Rahnasto, Vaasa (FI); Pekka Hemminki, Laihia (FI); Jani Matti Perkiö, Tampere (FI)

(73) Assignee: VACON OY, Vaasa (FI)

( * ) Notice: Subject to any disclaimer, the term of this patent is extended or adjusted under 35 U.S.C. 154(b) by 247 days.

(21) Appl. No.: 18/055,003

(22) Filed: Nov. 14, 2022

(65) Prior Publication Data
US 2023/0156981 A1    May 18, 2023

(30) Foreign Application Priority Data
Nov. 15, 2021  (DE) .......................... 102021129727.3

(51) Int. Cl.
*H02P 29/60* (2016.01)
*H02M 7/00* (2006.01)
*H05K 7/20* (2006.01)

(52) U.S. Cl.
CPC ........ *H05K 7/20945* (2013.01); *H02M 7/003* (2013.01); *H02P 29/60* (2016.02); *H05K 7/209* (2013.01); *H05K 7/20927* (2013.01)

(58) Field of Classification Search
CPC ......... H02P 29/60; H02P 29/68; H05K 7/209; H05K 7/20945; H02M 7/003
See application file for complete search history.

(56) References Cited

U.S. PATENT DOCUMENTS 5,712,802 A * 1/1998 Kumar ............... H05K 7/20918
                                                          702/45
8,238,131 B2 * 8/2012 Hedemaki .......... H03K 17/0828
                                                          363/141
(Continued)

FOREIGN PATENT DOCUMENTS

DE         697 18 405 T2    11/2003
DE    10 2004 018 578 A1    11/2005
(Continued)

*Primary Examiner* — Thai T Dinh
(74) *Attorney, Agent, or Firm* — McCormick, Paulding & Huber PLLC

(57) ABSTRACT

The invention is directed at an electric power converter, such as an electric motor drive for driving an electric motor. The converter includes a cooling system with a heat sink for dissipating thermal energy generated by the converter and with coolant flow means for cooling the heat sink, first measuring means for measuring the coolant inlet temperature, second measuring means for measuring the heat sink temperature, estimating means for estimating the thermal energy transferred to the heat sink, wherein the converter is provided for estimating the thermal resistance of the heat sink based on the measured temperatures and the estimated thermal energy transferred to the heat sink, for comparing the estimated thermal resistance to reference values and for outputting a signal, if the difference between the estimated thermal resistance and the reference values exceeds a threshold value. The invention is also directed at a method for operating the electric power converter.

20 Claims, 3 Drawing Sheets

(56) References Cited

U.S. PATENT DOCUMENTS

| | | | | |
|---|---|---|---|---|
| 9,768,668 B2* | 9/2017 | Imanishi | ................ | H02M 1/32 |
| 10,924,055 B2* | 2/2021 | Kuroki | .................... | H02M 5/44 |
| 11,248,966 B2* | 2/2022 | Sathik | .................... | H02P 29/68 |
| 11,423,203 B2* | 8/2022 | Zheng | ................ | H05K 7/20945 |
| 11,910,579 B2* | 2/2024 | Hoffmann | ................ | H02H 5/04 |
| 2012/0218027 A1* | 8/2012 | Ioannidis | ............. | H02M 7/003 |
| | | | | 327/513 |
| 2013/0285486 A1* | 10/2013 | Imanishi | ................ | H02M 1/32 |
| | | | | 310/53 |
| 2019/0383670 A1* | 12/2019 | Sathik | .................... | H02P 29/60 |
| 2022/0022345 A1* | 1/2022 | Hoffmann | .......... | H05K 7/20945 |

FOREIGN PATENT DOCUMENTS

| | | |
|---|---|---|
| DE | 10 2006 018 771 A1 | 10/2007 |
| EP | 3 672 007 A1 | 6/2020 |

* cited by examiner

ELECTRIC POWER CONVERTER, SUCH AS AN ELECTRIC MOTOR DRIVE FOR DRIVING AN ELECTRIC MOTOR AND METHOD FOR OPERATING THE ELECTRIC MOTOR DRIVE

CROSS-REFERENCE TO RELATED APPLICATION

This application claims foreign priority benefits under U.S.C. § 119 from German Patent Application No. 102021129727.3, filed Nov. 15, 2021, the content of which is hereby incorporated by reference in its entirety.

TECHNICAL FIELD

The invention is directed at an electric power converter, such as an electric motor drive (VFD) for driving an electric motor. The converter comprises a cooling system with a heat sink for dissipating thermal energy generated by the converter and with coolant flow means for cooling the heat sink, first measuring means for measuring the coolant inlet temperature, second measuring means for measuring the heat sink temperature, estimating means for estimating the thermal energy transferred to the heat sink, wherein the converter is provided for estimating the thermal resistance of the heat sink based on the measured temperatures and the estimated thermal energy transferred to the heat sink, for comparing the estimated thermal resistance to reference values and for outputting a signal, if the difference between the estimated thermal resistance and the reference values exceeds a threshold value. The invention is also directed at a method for operating the electric power converter.

BACKGROUND

Electric power converter may be used in detrimental environments such as dusty sur-roundings. The dust close to the converter may set on components of the converter such as its heat sink, thereby reducing the efficiency of said components. The heat sink of the converter may eventually be clogged by the dust, leading to a deterioration of the efficiency of the heat sink, the setting off of a temperature alarm, power loss reduction of the converter and finally the activation of an over-temperature trip. The output information concerning the trip or the alarm may indicate that the cooling air temperature of the air used for cooling the converter should be checked, that the quantity and flow of the cooling liquid used for cooling the converter should be checked and/or that it should be examined whether the heat sink has been clogged by e.g. dust. However, a problem common to the converters known from the art is that such alarms and/or trips tend to occur only after some substantial clogging of the heat sink has already occurred and, in a worst-case scenario, after a critical customer process has been stopped because of a malfunctioning electric power converter.

A common solution to this problem is to regularly check the state of the heat sink and to stick to stringent service guidelines of the converter. Unfortunately, performing heat sink checks may not be straightforward and may usually require the disassembly of the converter and/or probing the converter with an endoscope.

Known converters may be provided for indicating to a user of a converter at what intervals to check and clean the heat sink. However, it is usually difficult to indicate accurately how often a user should perform these actions. This is because the converter may be installed in various environments, e.g. clean or very dusty environments with considerable amounts of impurities in the air surrounding the electric power convert. It is usually not convenient for the user of a converter to check or monitor the quality of the air in the vicinity of the converter. Also, it is similarly inconvenient to frequently check the heat sink for impurities or clogging when the converter is operating.

SUMMARY

The aim of the present invention is to provide an improved electric power converter and a method for operating the converter, which overcome the above-mentioned deficiencies. This aim is reached by an electric power converter according to claim 1 and a method for operating the electric power converter according to claim 9. Preferred embodiments of the invention are subject to the dependent claims.

According to claim 1, an electric power converter, such as an electric motor drive for driving an electric motor is provided. The electric power converter may be any other AC-DC, DC-DC or DC-AC application, such as an active front end, grid converter, or non-regenerative frond-end (NFE). Although reference may be made to a drive in the present description, this may also refer more generally to an electric power converter. The drive comprises a cooling system with a heat sink for dissipating thermal energy generated by the drive and with coolant flow means for cooling the heat sink. The thermal energy generated by the drive is usually dissipated into the air surrounding the drive. The drive further comprises first measuring means for measuring the coolant inlet temperature, second measuring means for measuring the heat sink temperature and estimating means for estimating the thermal energy transferred to the heat sink. The thermal energy transferred to the heat sink corresponds to the thermal energy dissipated to the heat sink by components of the electric motor drive, such as power semiconductors. Momentary thermal energy transferred to the heatsink may be estimated based on actual operating conditions of a give component such as currents, voltages and others.

According to the invention, the drive is provided for estimating the thermal resistance of the heat sink based on the measured temperatures and the estimated thermal energy transferred to the heat sink, for comparing the estimated thermal resistance to reference values and for outputting a signal, if the difference between the estimated thermal resistance and the reference values exceeds a threshold value. The drive may advantageously be operated under similar load conditions as when the previously measured reference temperatures were acquired.

The present invention makes it possible to improve predictive maintenance of the electric motor drive. It enables the user of the drive to derive the heat sink clogging level from the estimated thermal resistance. The user may be made aware of an excessive clogging by a corresponding clogging alarm of the drive. He is no longer reliant on a mere temperature alarm/trip, which may occur for any other reasons than a clogging off the heat sink. The invention makes it possible to implement a clogging alarm, which may indicate the onset or some early stage of a heat sink clogging. This may be useful to the user in case he wants to keep the product lifetime as long as possible.

In a preferred embodiment of the invention, the reference values are pre-set values and/or calculated values and/or previously estimated thermal resistance values. Clearly, the drive may comprise some computing device for performing all required measurements and control steps of the present invention.

In another preferred embodiment of the invention, the first measuring means are spaced apart from the coolant inlet and measure the coolant inlet temperature indirectly. As the first measuring means do not have to be provided adjacent to the coolant inlet of the cooling systems, no dedicated measuring means are required in this embodiment. Instead, some temperature measuring means already present in and/or used by the drive, may give a sufficiently close approximation of the coolant inlet temperature.

In another preferred embodiment of the invention, the heat sink temperature is measured close to or inside a heat source. The heat source may be any heat generating component of the drive. This measurement may also yield sufficiently close approximations of the heat sink temperature. This is particularly true in cases in which a heat source is provided close to the heat sink. In a case in which a heat source comprises a temperature measuring device as a built-in feature, no additional temperature measuring devices are necessary for estimating the heat sink temperature.

In another preferred embodiment of the invention, the drive is provided for estimating the performance of the cooling system based on the coolant flow rate, wherein the drive estimates the thermal resistance of the heat sink based on the performance of the cooling system. In this case, a decreased coolant flow rate may be the result of a clogged heat sink. If a decreased coolant flow rate is detected by the drive, it may be deduced that a clogging of the heat sink has occurred.

In a particularly preferred embodiment of the invention, the coolant flow rate is estimated based on a control algorithm for controlling the coolant flow means and/or estimated based on sensor information received from the coolant flow means.

In another preferred embodiment of the invention, predefined correction factors for estimating the thermal resistance are provided, wherein the correction factors are a function of the coolant flow rate.

In another preferred embodiment of the invention, the drive is provided for estimating the performance of the cooling system based on the altitude, say, over sea level, and/or ambient pressure at which the drive is operated, wherein the drive estimates the thermal resistance of the heat sink based on the performance of the cooling system. The altitude and/or ambient pressure at which the drive is operated may be used to generate some correction factor for improving the estimation of the performance of the cooling system.

The invention is also directed at a method according to claim 9, for operating an electric motor drive for driving an electric motor, said drive comprising a cooling system with a heat sink for dissipating thermal energy generated by the drive and with coolant flow means for cooling the heat sink, first measuring means for measuring the coolant inlet temperature, second measuring means for measuring the heat sink temperature, estimating means for estimating the thermal energy transferred to the heat sink, wherein the drive estimates the thermal resistance of the heat sink based on the measured temperatures and the estimated thermal energy transferred to the heat sink, compares the estimated thermal resistance to reference values and outputs a signal, if the difference between the estimated thermal resistance and the reference values exceeds a threshold value. The method may be combined to include further steps related to the features described above with reference to the electric motor drive itself.

BRIEF DESCRIPTION OF THE DRAWINGS

Further details and advantages of the invention are described with reference to the figures. The figures show.

DETAILED DESCRIPTION

Figure 1:
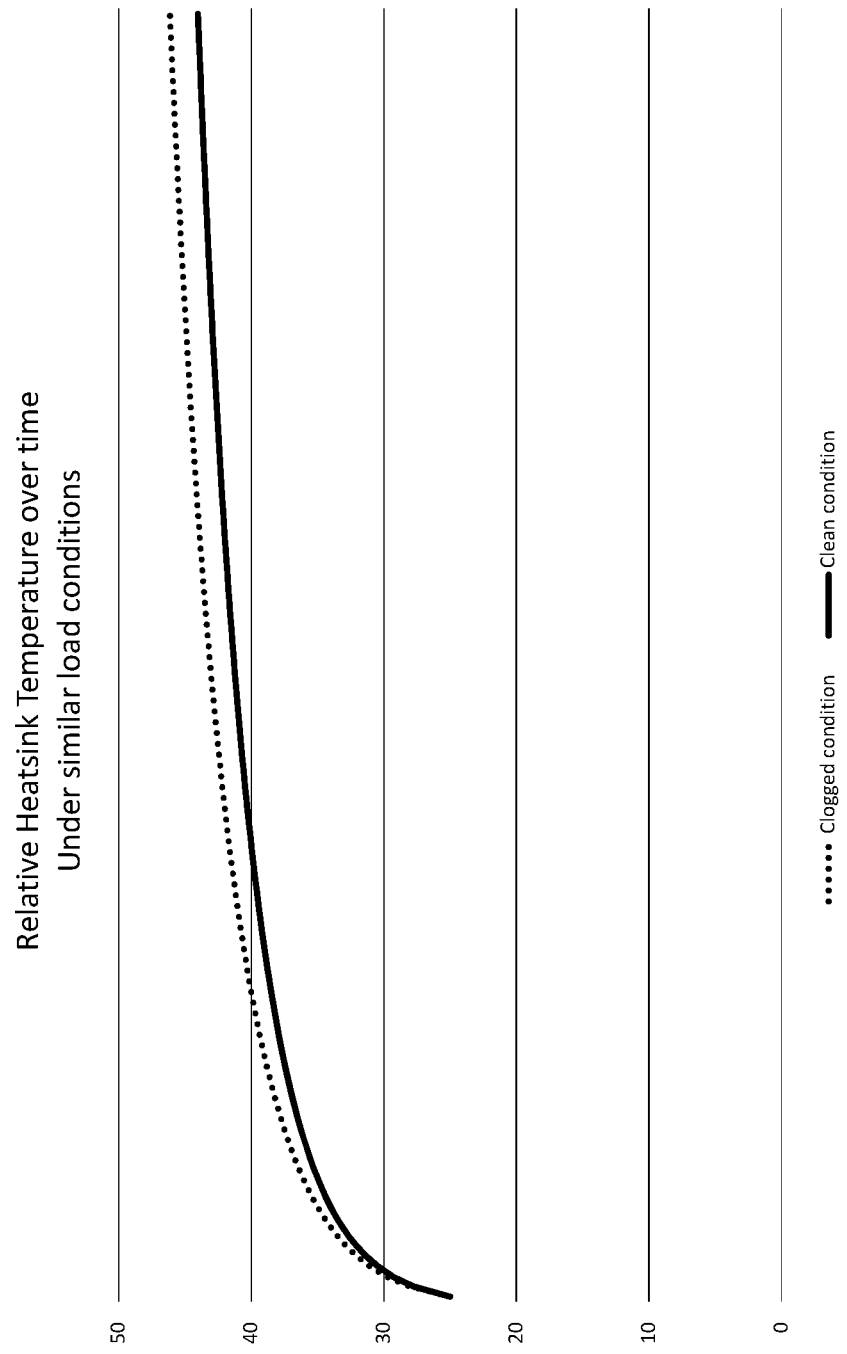
FIG. 1: heat sink temperature over time in clean and clogged conditions of heat sink.

FIG. 1 shows heat sink temperature curves over time of an electric motor drive of the present invention. The lower, solid line shows the temperature curve of a heat sink of an electric motor drive in clean conditions, i.e. without significant clogging occurring at the heat sink. The upper, dotted line shows the temperature curve of a heat sink of an electric motor drive in clogged conditions, i.e. with significant clogging and corresponding performance reduction occurring at the heat sink.

Figure 2:
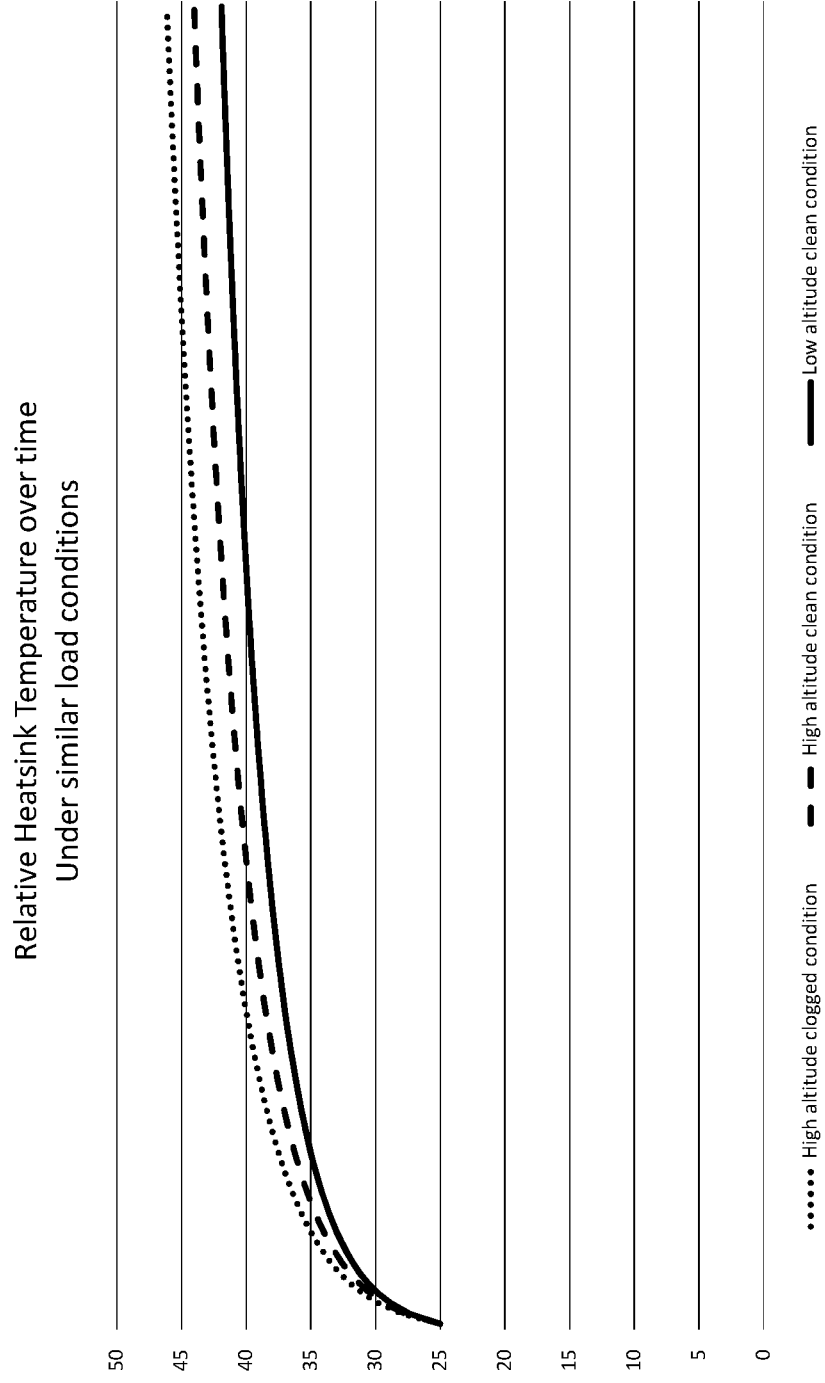
FIG. 2: heat sink temperature over time in high and low altitude conditions of heat sink.

FIG. 2 also shows heat sink temperature curves over time of an electric motor drive of the present invention. However, the lower, solid line shows the temperature curve of a heat sink in low altitude and clean conditions, i.e. without significant clogging occurring at the heat sink. The middle, dashed line shows the temperature curve of a heat sink in high altitude and clean conditions, i.e. also without significant clogging, but with different ambient conditions adversely affecting the performance of the heat sink. The upper, dotted line shows the temperature curve of a heat sink in high altitude and clogged conditions and the corresponding greatest performance reduction of the heat sink.

Figure 3:
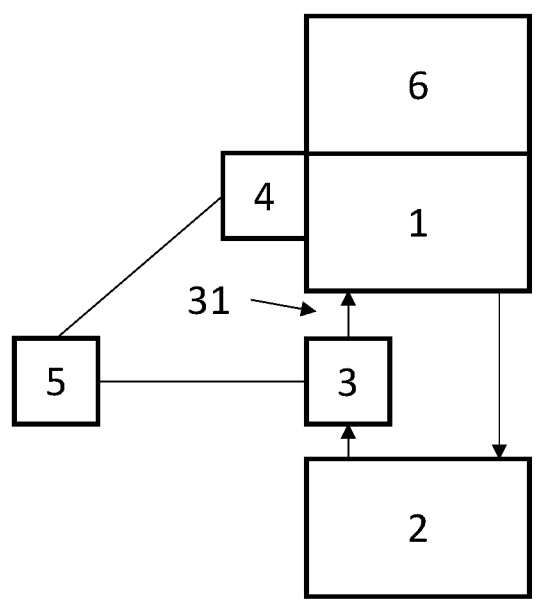
FIG. 3: schematic view of an electric motor drive according to the invention.

FIG. 3 is a schematic view of an electric motor drive for driving an electric motor according to the present invention. The motor drive comprises a cooling system with a heat sink 1 for dissipating thermal energy generated by the drive and with coolant flow means 2 for cooling the heat sink 1. First measuring means 3 are provided for measuring the coolant inlet 31 temperature of the coolant liquid used for cooling the heat sink 1. Second measuring means 4 are provided for measuring the heat sink 1 temperature. The drive further comprises estimating means 5 for estimating the thermal energy transferred to the heat sink 1. The estimating means 5 may be or comprise some computing device, which may be connected to various subsystems of the drive for gathering data and for outputting signals.

The drive is provided for estimating the thermal resistance Rth of the heat sink 1 based on the measured temperatures and the estimated thermal energy transferred to the heat sink 1, for comparing the estimated thermal resistance Rth to reference values and for outputting a signal if the difference between the estimated thermal resistance Rth and the reference values exceeds a threshold value. All computing required for providing the presently described functions may be performed by the estimating means 5 or some other suitable device provided with the drive or connected to it.

The reference values may be pre-set values and/or calculated values and/or previously estimated thermal resistance Rth values. Said values may be provided in or to the estimating means 5.

In the embodiment of FIG. 3, the first measuring means 3 are provided directly at the coolant inlet 31. Additionally or alternatively, the first measuring means 3 may be spaced apart from the coolant inlet 31 and measure the coolant inlet 31 temperature indirectly. Other temperature sensor readings from the drive can be used to estimate the ambient temperature of the drive instead of a direct sensor reading of the coolant inlet. However, the accuracy of the temperature reading will be lower in this case than if the temperature is measured directly at the coolant inlet. It is therefore possible to use already present measuring means for estimating the temperature of the coolant fluid. As no additional hardware has to be provided, the costs of the motor drive can be reduced accordingly.

In the embodiment of FIG. 3, the heat sink 1 temperature is measured close to a heat source 6 by second measuring means 4. The heat source 6 may be any or all of the motor drive's components, required for providing the motor drive's functions. Additionally or alternatively, the second measuring means 4 may be provided at a distance to the heat sink 1 or inside the heat sink 1.

In order to reduce the impact of a clogged heat sink 1, the drive may be operated according to a method, wherein the drive estimates the thermal resistance Rth of the heat sink 1 based on the measured temperatures and the estimated thermal energy transferred to the heat sink 1, compares the estimated thermal resistance Rth to reference values and outputs a signal, if the difference between the estimated thermal resistance Rth and the reference values exceeds a threshold value. The output signal may indicate to a user of the drive that substantial clogging of the heat sink 1 is occurring or is about to occur and that certain measures are suggested to overcome the clogging and prevent further detrimental effects of the clogging. Information can be output to a user in several ways. An output message might specify the change in cooling performance and indicate some maintenance activity of the cooling system, which should be performed based on the retrieved estimations. A user may receive some information indicating an ambient temperature range at which full load capability of the drive can still be provided, even if some clogging of the heat sink 1 has already occurred and/or the drive may adjust parameters to protect itself from reduced lifetime and/or damages from overheating.

The invention makes it possible to improve the quality of predictive maintenance measures. It enables a user of the drive to receive signals indicative off the level of heat sink 1 clogging occurring at the heat sink 1. Additionally or alternatively, the user may receive some sort of alarm indicating the actual occurrence of a heat sink 1 clogging rather than an alarm merely indicating some temperature deviation occurring at the heat sink 1, which may be due to other factors than a clogging of the heat sink 1.

As a result, a predictive maintenance schedule of the drive can be improved, whereby predictive maintenance actions are only performed once a corresponding alarm/trip has been output by the drive. Also, the presently described clogging indication makes it possible to use clogging alarms in cases in which a user of the drive intents to extend the lifetime of an electric motor drive as much as possible.

The invention makes it possible to estimate the cooling capability of the drive or rather its heat sink 1 during its operation and without physically altering the drive. The estimation is based on monitoring the temperature rise over the cooling device and/or or cooling system. The estimated cooling capability is divided by the estimated power loss transferred to and dissipated by the cooling system. The outcome is known as the thermal resistance of the cooling system or the heat sink 1. The change in thermal resistance Rth over the time is indicated in FIGS. 1 and 2 and is representative of the condition of the cooling system of the drive.

The Increase of thermal resistance indicates how much the cooling performance of the cooling system has decreased. It gives a clear and concrete value for the user of the drive, indicating by how much the airflow around a clogged up heat sink 1 has decreased.

Thermal resistance may also provide significant information in case the drive has not been serviced properly or is installed in detrimental environments that may lead to premature malfunctions of the drive.

If the drive is provided for issuing an alarm signal in dependence on the thermal resistance Rth of the heat sink 1, said alarm can be used for keeping the performance and lifetime of the drive in a desired optimum range.

The invention can be utilised in a most accurate way in drives containing coolant inlet temperature sensing and/or heat sink 1 temperature sensing provided close to or inside a heat source like an IGBT-module. The estimation of the cooling capability of the heat sink 1 may be based on the measured temperature difference between these two temperature sensors and on estimated power losses generated on the heat sink 1. The temperature difference is strongly dependent on loading conditions of the drive due to increased power losses. The outcome of this estimation is the thermal resistance Rth value of the cooling system at a given state. The estimated thermal resistance Rth value is compared to a reference value, which can be pre-set or an outcome off a sequence, which estimates the reference value at the beginning of a considered period of time. Information on the difference between the estimated value and the reference value may be used to indicate the clogging level of the heat sink 1.

Changes in the performance of the cooling system may be caused by changes of the control parameters of the cooling system and/or installation parameters like the altitude at which the drive is present. The range of allowable altitudes for the installation of the drive is typically specified to be rather wide. However, altitude has a similar effect on the cooling performance as the velocity of the coolant flow, especially in air cooled drives. The higher the installation altitude, the lower the cooling performance with the same flow rate that can be expected. Changes of the cooling system performance characteristics, which are due to changes in the altitude of operation of the drive, may be corrected by predefined correction factors, once the altitude is known.

Control parameters controlling the cooling system may influence the velocity of a coolant flow, which in return will naturally influence thermal resistance Rth value of the cooling system as well. Possible errors in the estimation of the thermal resistance Rth value caused by the change of the coolant flow can be accounted for and reduced by using predefined correction factors of the thermal resistance Rth value as a function of the velocity of the coolant flow. The velocity of the coolant flow itself can be estimated either by measuring the flow directly or by estimating it based on the control algorithm of the cooling system generating or controlling the flow and/or based on sensing information received from the cooling system.

The present invention offers an improved electric motor drive to a user, which makes it easier to decide when maintenance activities should be performed. The risk of undesired process stopping due to clogged up heat sinks 1 is decreased, especially when sufficient service is provided to the drive.

In order to verify whether a heat sink 1 is clogged, it is not necessary to open the drive, thus saving time and money.

As the described drive and method may be based on an existing drive with no additional hardware and only software-based implementation of the invention, costs of providing said invention can be kept low.

The cooling performance decrease is determined using a clearly measurable unit, i.e. the temperatures occurring at the drive and corresponding heat transfer rates. According to the invention, it is possible to optimise the operation and extend the lifetime of an electric motor drive.

As the performance of the heat sink 1 can be monitored according to the invention, it is possible to conclude whether or not the drive is installed in a supported environment, i.e. in an environment suitable for the operation of the drive.

It is also possible to install the drive-in environments, which are harsher then would normally be allowable. The heat sink 1 can be in monitored according to the invention, such that the performance and lifetime of the drive can be optimised with smaller risks even in such harsh environments.

While the present disclosure has been illustrated and described with respect to a particular embodiment thereof, it should be appreciated by those of ordinary skill in the art that various modifications to this disclosure may be made without departing from the spirit and scope of the present disclosure.

The invention claimed is:

1. An electric power converter comprising:
a cooling system with a heat sink for dissipating thermal energy generated by the converter and with coolant flow means for cooling the heat sink;
first measuring means for measuring the coolant inlet temperature;
second measuring means for measuring the heat sink temperature; and
estimating means for estimating the thermal energy transferred to the heat sink, wherein the converter is provided for estimating the thermal resistance (Rth) of the heat sink based on the measured temperatures and the estimated thermal energy transferred to the heat sink, for comparing the estimated thermal resistance (Rth) to reference values and for outputting a signal when a difference between the estimated thermal resistance (Rth) and the reference values exceeds a threshold value.

2. The electric power converter according to claim 1, wherein the reference values are pre-set values and/or calculated values and/or previously estimated thermal resistance (Rth) values.

3. The electric power converter according to claim 2, wherein the first measuring means are spaced apart from the coolant inlet and measure the coolant inlet temperature indirectly.

4. The electric power converter according to claim 2, wherein the heat sink temperature is measured close to or inside a heat source.

5. The electric power converter according to claim 2, wherein the converter is provided for estimating the performance of the cooling system based on the coolant flow rate, wherein the converter estimates the thermal resistance (Rth) of the heat sink based on the performance of the cooling system.

6. The electric power converter according to claim 2, wherein the converter is provided for estimating the performance of the cooling system based on the altitude and/or ambient pressure at which the converter is operated, wherein the converter estimates the thermal resistance (Rth) of the heat sink based on the performance of the cooling system.

7. The electric power converter according to claim 1, wherein the first measuring means are spaced apart from the coolant inlet and measure the coolant inlet temperature indirectly.

8. The electric power converter according to claim 7, wherein the heat sink temperature is measured close to or inside a heat source.

9. The electric power converter according to claim 7, wherein the converter is provided for estimating the performance of the cooling system based on the coolant flow rate, wherein the converter estimates the thermal resistance (Rth) of the heat sink based on the performance of the cooling system.

10. The electric power converter according to claim 7, wherein the converter is provided for estimating the performance of the cooling system based on the altitude and/or ambient pressure at which the converter is operated, wherein the converter estimates the thermal resistance (Rth) of the heat sink based on the performance of the cooling system.

11. The electric power converter according to claim 1, wherein the heat sink temperature is measured close to or inside a heat source.

12. The electric power converter according to claim 11, wherein the converter is provided for estimating the performance of the cooling system based on the coolant flow rate, wherein the converter estimates the thermal resistance (Rth) of the heat sink based on the performance of the cooling system.

13. The electric power converter according to claim 11, wherein the converter is provided for estimating the performance of the cooling system based on the altitude and/or ambient pressure at which the converter is operated, wherein the converter estimates the thermal resistance (Rth) of the heat sink based on the performance of the cooling system.

14. The electric power converter according to claim 1, wherein the converter is provided for estimating the performance of the cooling system based on the coolant flow rate, wherein the converter estimates the thermal resistance (Rth) of the heat sink based on the performance of the cooling system.

15. The electric power converter according to claim 14, wherein the coolant flow rate is estimated based on a control algorithm for controlling the coolant flow means and/or estimated based on sensor information received from the coolant flow means.

16. The electric power converter according to claim 15, wherein predefined correction factors for estimating the thermal resistance (Rth) are provided, wherein the correction factors are a function of the coolant flow rate.

17. The electric power converter according to claim 14, wherein predefined correction factors for estimating the thermal resistance (Rth) are provided, wherein the correction factors are a function of the coolant flow rate.

18. The electric power converter according to claim 14, wherein the converter is provided for estimating the performance of the cooling system based on the altitude and/or ambient pressure at which the converter is operated, wherein the converter estimates the thermal resistance (Rth) of the heat sink based on the performance of the cooling system.

19. The electric power converter according to claim 1, wherein the converter is provided for estimating the performance of the cooling system based on the altitude and/or ambient pressure at which the converter is operated, wherein the converter estimates the thermal resistance (Rth) of the heat sink based on the performance of the cooling system.

20. A method for operating an electric power converter for driving an electric motor,
- said converter comprising a cooling system with a heat sink for dissipating thermal energy generated by the converter and with coolant flow means for cooling the heat sink,
- first measuring means for measuring the coolant inlet temperature,
- second measuring means for measuring the heat sink temperature,
- estimating means for estimating the thermal energy transferred to the heat sink, wherein the converter estimates the thermal resistance (Rth) of the heat sink based on the measured temperatures and the estimated thermal energy transferred to the heat sink,
- compares the estimated thermal resistance (Rth) to reference values and outputs a signal when a difference between the estimated thermal resistance (Rth) and the reference values exceeds a threshold value.

* * * * *